United States Patent
Douma et al.

(10) Patent No.: US 8,447,153 B2
(45) Date of Patent: May 21, 2013

(54) LOW INDUCTANCE OPTICAL TRANSMITTER SUBMOUNT ASSEMBLY

(75) Inventors: Darin James Douma, Monrovia, CA (US); The 'Linh Nguyen, San Jose, CA (US); Hongyu Deng, Saratoga, CA (US); Martin Kalberer, Redwood City, CA (US); Maziar Amirkiai, Sunnyvale, CA (US)

(73) Assignee: Finisar Corporation, Sunnyvale, CA (US)

( * ) Notice: Subject to any disclaimer, the term of this patent is extended or adjusted under 35 U.S.C. 154(b) by 594 days.

(21) Appl. No.: 11/740,781

(22) Filed: Apr. 26, 2007

(65) Prior Publication Data

US 2007/0289764 A1 Dec. 20, 2007

Related U.S. Application Data

(60) Provisional application No. 60/745,822, filed on Apr. 27, 2006.

(51) Int. Cl.
*G02B 6/35* (2006.01)
*G02B 6/26* (2006.01)

(52) U.S. Cl.
USPC .............................. 385/40; 385/94

(58) Field of Classification Search
USPC ................................... 385/94, 40
See application file for complete search history.

(56) References Cited

U.S. PATENT DOCUMENTS

| | | | |
|---|---|---|---|
| 5,052,808 A | 10/1991 | Hilby | |
| 5,386,141 A | 1/1995 | Liang et al. | |
| 6,590,706 B1 | 7/2003 | Xie | |
| 6,841,815 B2* | 1/2005 | Nguyen et al. | 257/293 |
| 6,847,053 B2 | 1/2005 | Kuhara et al. | |
| 6,868,104 B2 | 3/2005 | Stewart | |
| 6,873,800 B1 | 3/2005 | Wei | |
| 6,876,004 B2* | 4/2005 | Rosenberg et al. | 257/81 |
| 6,920,161 B2* | 7/2005 | Riaziat et al. | 372/36 |
| 6,940,885 B1 | 9/2005 | Cheng | |

(Continued)

FOREIGN PATENT DOCUMENTS

| | | |
|---|---|---|
| CN | 2007800152873 | 12/2009 |
| JP | 2004259880 A | 9/2004 |
| KR | 10-2008-7028988 | 10/2010 |

OTHER PUBLICATIONS

U.S. Appl. No. 12/506,093, filed Jul. 20, 2009, Kalberer.

(Continued)

*Primary Examiner* — K. Cyrus Kianni
(74) *Attorney, Agent, or Firm* — Maschoff Brennan

(57) ABSTRACT

A low inductance structure for improving the integrity of data signals carried in an optical subassembly is disclosed. In one embodiment the optical subassembly comprises a housing containing a lens assembly and an optical isolator. The optical subassembly further includes an optoelectronic package having a base defining a mounting surface that cooperates with a cap to define a hermetic enclosure. First and second signal leads of the subassembly include ends that extend into the hermetic enclosure. A submount is disposed on the base mounting surface. A low inductance structure is integrally formed with the submount and includes a dielectric body interposed between the first and second leads. The body includes shaped edges and conductive pad structures in electrical communication with conductive traces disposed on the submount. Each pad structure is also in electrical communication with a respective one of the first and second signal leads via a plurality of wirebonds.

13 Claims, 11 Drawing Sheets

U.S. PATENT DOCUMENTS

| | | | |
|---|---|---|---|
| 7,061,949 B1* | 6/2006 | Zhou et al. | 372/36 |
| 7,210,862 B2 | 5/2007 | Yoshikawa | |
| 7,211,830 B2* | 5/2007 | Rosenberg | 257/81 |
| 7,229,295 B2 | 6/2007 | Ice et al. | |
| 7,267,553 B2 | 9/2007 | Sone | |
| 7,492,798 B2 | 2/2009 | Deng | |
| 2002/0118904 A1 | 8/2002 | Man et al. | |
| 2003/0102157 A1* | 6/2003 | Rosenberg et al. | 174/261 |
| 2003/0138008 A1* | 7/2003 | Riaziat et al. | 372/36 |
| 2003/0152390 A1 | 8/2003 | Stewart | |
| 2003/0178657 A1* | 9/2003 | Nguyen et al. | 257/292 |
| 2005/0047731 A1 | 3/2005 | Hu et al. | |
| 2005/0105911 A1 | 5/2005 | Keh | |
| 2005/0116239 A1* | 6/2005 | Rosenberg et al. | 257/81 |
| 2005/0162761 A1 | 7/2005 | Hargis et al. | |
| 2005/0185900 A1 | 8/2005 | Farr | |
| 2005/0201433 A1* | 9/2005 | Riaziat et al. | 372/36 |
| 2005/0249450 A1 | 11/2005 | Schrodinger | |
| 2006/0022213 A1 | 2/2006 | Posamentier | |
| 2006/0192221 A1* | 8/2006 | Zhou et al. | 257/98 |

OTHER PUBLICATIONS

Agilent Technologies, et al., Small Form-factor Pluggable (SFP) transceiver Multi Source Agreement (MSA), Cooperation Agreement for Small Form-Factor Pluggable Transceivers, Sep. 14, 2000.
Lee W. Young, Written Opinion of the International Searching Authority, Apr. 2, 2008, US.
U.S. Appl. No. 11/456,848, Oct. 18, 2007, Office Action.
U.S. Appl. No. 11/456,848, May 20, 2008, Notice of Allowance.
U.S. Appl. No. 11/456,848, Oct. 9, 2008, Notice of Allowance.
U.S. Appl. No. 12/506,093, Sep. 7, 2010, Office Action.
CN2007800152873 Office Action, Mar. 2, 2011, Douma et al.
DE112007001048.7 Office Action, Aug. 26, 2011, Douma et al.
JP2009-507983 Office Action, Aug. 24, 2011, Douma et al.
TW096114670 Office Action, Dec. 10, 2010, Douma et al.
International Search mailed Feb. 15, 2008 as received in related International Application No. PCT/US2007/067620.
U.S. Appl. No. 12/506,094, Feb. 22, 2011, Notice of Allowance.

* cited by examiner

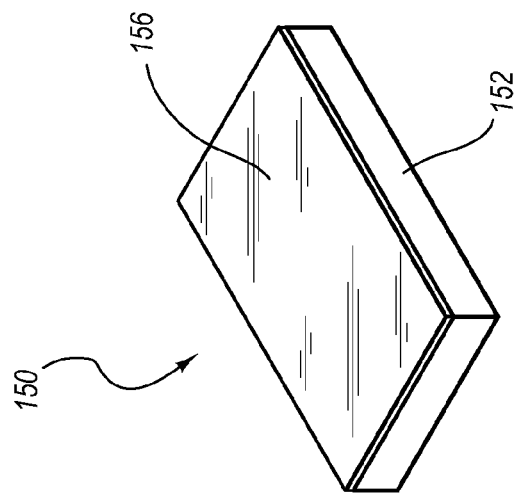
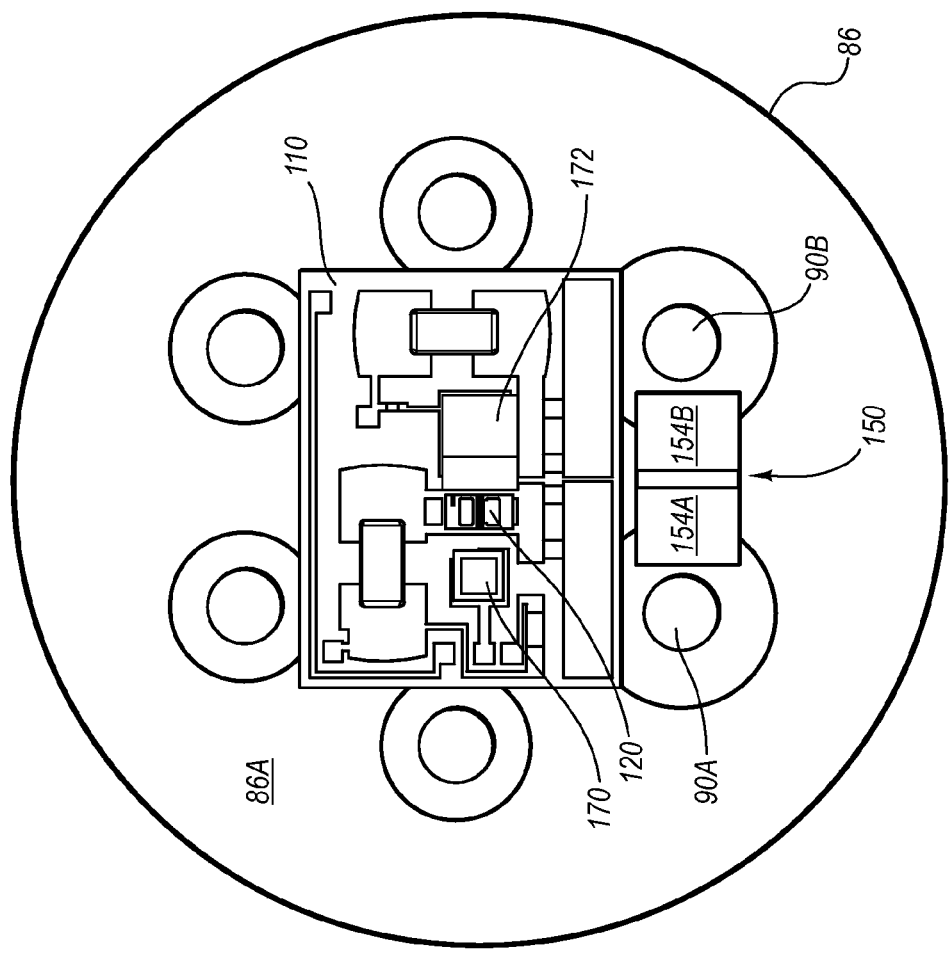

LOW INDUCTANCE OPTICAL TRANSMITTER SUBMOUNT ASSEMBLY

CROSS-REFERENCE TO RELATED APPLICATIONS

This application claims the benefit of the U.S. Provisional Patent Application No. 60/745,822, filed Apr. 27, 2006, and entitled "LOW INDUCTANCE OPTICAL TRANSMITTER SUBMOUNT ASSEMBLY," which is incorporated herein by reference in its entirety.

BACKGROUND

1. Technology Field

The present invention generally relates to optoelectronic packages. In particular, embodiments of the present invention relate to a submount assembly for an optoelectronic package of a communications module that assists in providing a low inductance electrical data path for an optical transmitter or receiver of the package.

2. The Related Technology

Specified Multi-Source Agreements ("MSAs") govern various aspects of data-containing optical signals that are both transmitted and received by communication modules, such as optical transceiver modules ("transceivers"), which are typically employed in high-speed communications networks. One aspect related to certain MSAs is the differential nature of electrical data signals that contain data for transmission or reception by components of the transceiver. In general, data carried to, from, or within the transceiver are often transmitted via dual data paths. The dual data paths operate as differential data paths, wherein one data path operates as the inverse of the other. For example, a logical "1" to be carried will be represented on a first of the dual data paths as a relatively high value, while on the second data path it is represented as a relatively low value. Correspondingly, a logical "0" would be inversely represented as a relatively low value on the first data path and a relatively high value on the second data path. This enables digital interpretation of a logical "1" or "0" in the context of differential data paths by defining a particular relationship between the two data paths as signifying either a "1" or a "0" and then interpreting the received signal accordingly.

Typical transceiver designs include a single differential transmit data pathway including dual transmit data lines, and a single differential receive data pathway including dual receive data lines. When the transceiver is received by a host device, these differential transmit and receive data pathways operably connect with corresponding data pathways of the host so as to enable the transmission and reception of the data signals carried by the differential transmit and receive data paths to flow between the transceiver and the host.

As data rates increase within communication networks, solutions are constantly being sought to accommodate such rates while at the same time maintaining the integrity of the data signal. One aspect in maintaining data signal integrity includes maintaining signal inductance within acceptable levels. However, as data rates continue to rise and transceiver designs evolve to follow suit, the maintenance of signal line inductance below excessive limits becomes more challenging. Correspondingly, a need exists in the art for an optoelectronic device having a design that is capable of transferring data signals at prevailing data rates while assisting to maintain signal line inductance within acceptable levels.

BRIEF SUMMARY

The present invention has been developed in response to the above and other needs in the art. Briefly summarized, embodiments of the present invention are directed to a low inductance structure for improving the integrity of data signals carried in an optical subassembly, such as a transmitter optical subassembly.

In one embodiment the optical subassembly comprises a housing containing a lens assembly and an optical isolator. A nosepiece is included with the housing. The optical subassembly further includes an optoelectronic package having a base defining a mounting surface that cooperates with a cap to define a hermetic enclosure. First and second signal leads of the subassembly include ends that extend into the hermetic enclosure. A submount is disposed on the base mounting surface.

A low inductance structure is integrally formed with the submount and includes a dielectric body interposed between the first and second leads. The body includes shaped edges that correspond to the shape of outer perimeter portions of the first and second leads. The body further includes conductive pad structures in electrical communication with conductive traces disposed on the submount. Each pad structure is also in electrical communication with a respective one of the first and second signal leads via a plurality of wirebonds. In this way, a relatively low inductance differential signal path is defined from the first and second signal leads to an optoelectronic component, such as a laser diode, disposed on the mounting surface.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 6 is a top view of an interior surface of a TO package including a low inductance structure that is configured in accordance with one embodiment;

FIG. 7 is a perspective view of a bottom surface of the low inductance structure of FIG. 6A;

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-13B depict various features of embodiments of the present invention, which are generally directed to an optoelectronic device that is employed in connection with a communications module. In one possible implementation, the optoelectronic device is a transistor outline package included in a transmitter optical subassembly of an optical transceiver module. Inductance along two high speed differential signal lines within the transistor outline package may be problematic for proper data signal transfer if not suitably controlled.

Embodiments of the present invention assist in providing a low inductance path between the differential high speed signal line leads of a base portion of the transistor outline package and a submount positioned on the base. In particular, a low inductance structure is placed on the package base proximate the submount such that it is at least partially interposed between the differential signal lines of the submount. The extension piece enables a relatively greater number of relatively short wire bonds to be used in transferring data signals between the differential signal lines and the submount. The extension piece also provides capacitive and other electrical characteristics that result in lowering total inductance of the signal path and ensuring high signal integrity. The design and configuration of the low inductance structure can be modified according to various factors and can be implemented in various types of optoelectronic packages where low signal line inductance is preferred or needed.

1. Exemplary Operating Environment

Figure 1:
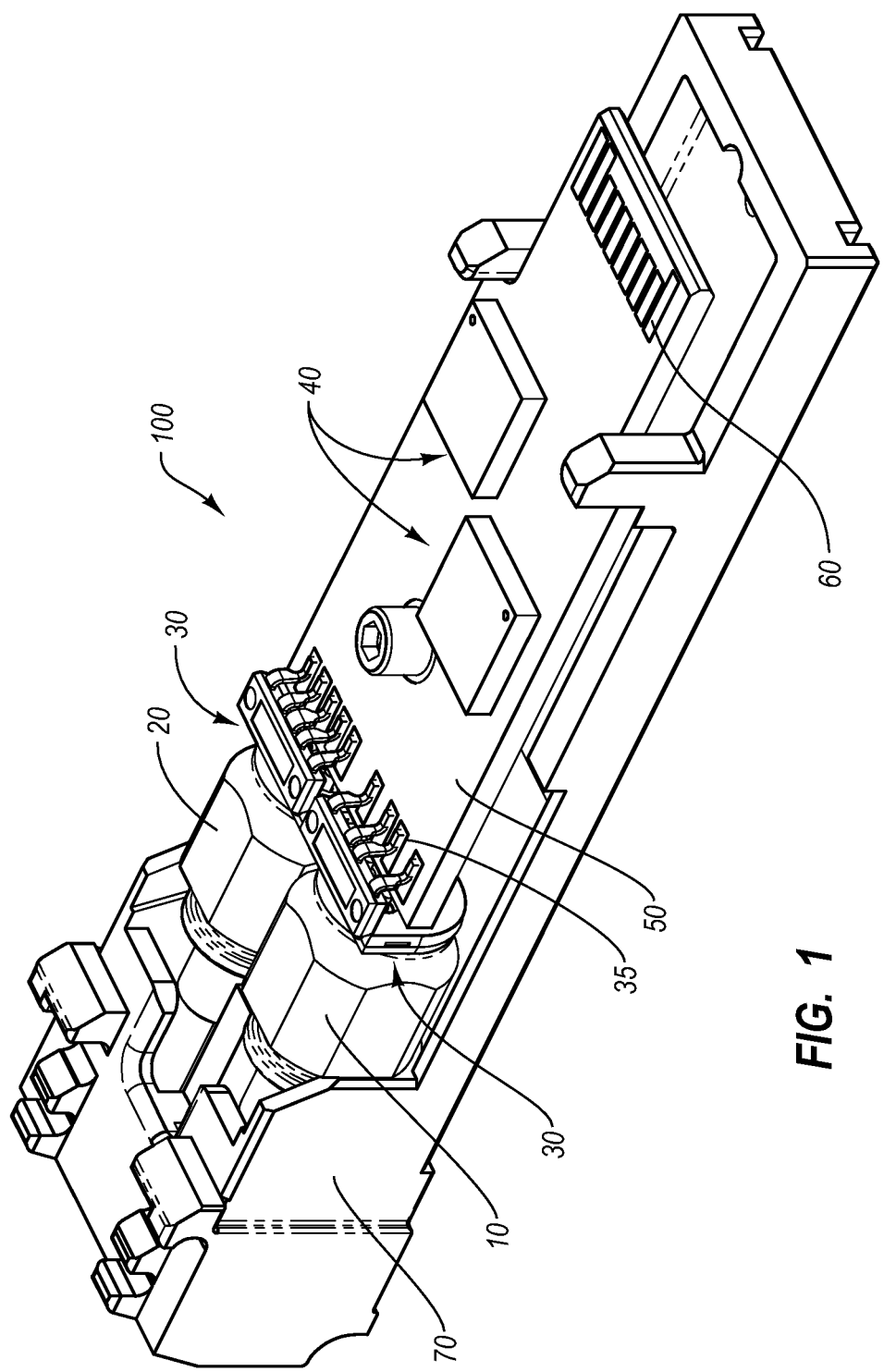
FIG. 1 is a perspective view of an optical transceiver module that is configured in accordance with embodiments of the present invention.

Reference is first made to FIG. 1, which depicts a perspective view of an optical transceiver module ("transceiver"), generally designated at 100, for use in transmitting and receiving optical signals in connection with an external host (not shown) that is operatively connected in one embodiment to a communications network. As shown, the transceiver of FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads 35 located on the PCB 50. Alternatively, other structures, such as flexible circuits, could also be used for the electrical interfaces. The electronic components 40 are also attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20 and the host.

In addition, the above-mentioned components of the transceiver 100 are partially housed within a shell 70. Though not shown, a cover can cooperate with the shell 70 to define a housing for the components of the transceiver 100. The transceiver 100 as shown in FIG. 1 is inverted such that the surfaces shown facing up in the figure are typically described as being the bottom of the transceiver. Thus, the references of "top" and "bottom" given herein are merely for purposes of ease and clarity in describing embodiments of the present invention.

Note that, while the optical transceiver 100 in which embodiments of the present invention can be practiced will be described in some detail, it is described by way of illustration only, and is not intended to restrict the scope of the invention. Indeed, other optical, optoelectronic, and electronic devices and components having a need for low signal line inductance can similarly benefit from embodiments of the present invention.

The optical transceiver 100 described and illustrated herein conforms to the small form pluggable ("SFP") form factor and operating standards as dictated by the corresponding multi-source agreement ("MSA") known in the industry. This notwithstanding, the embodiments of the present invention can be practiced with transceivers configured for optical signal transmission and reception at a variety of per-second data rates, including but not limited to 1 Gbit, 2 Gbit, 4 Gbit, 8 Gbit, 10 Gbit, or higher bandwidth fiber optic links. Furthermore, principles of the present invention can be implemented in optical transceivers of any form factor such as XFP and SFF, without restriction.

By way of brief overview, the transceiver 100 during operation can receive a data-containing electrical signal from an external host (not shown), which host can be any computing or communication system or device capable of communicating with the optical transceiver 100 for transmission of a data-carrying optical signal to an optical fiber (not shown). The electrical data signal supplied to the transceiver 100 from the host is carried in the transceiver 100 via a pair of differential transmit signal lines (not shown). Each signal line of the differential signal line pair carries one of two streams of the data signal that differ from each other only in signal polarity. As such, the lines are respectively referred to with a "+" or a "−" indicator, indicating the respective positive or negative polarity of each line. This opposing polarity of the differential electrical data signal streams facilitates more accurate deciphering of the data contained therein by expanding the differential magnitude between a logical "1" bit and a logical "0" bit. As such, the differential electrical data signals represent a single stream of digital data that travel in the same propagation direction.

The electrical differential data signal is provided to a light source, such as a laser located in the TOSA 20, which converts the electrical signal into a data-carrying optical signal for emission on to an optical fiber and transmission via an optical communications network, for instance. The laser can be a vertical cavity surface emitting laser ("VCSEL"), a distributed feedback ("DFB") laser, Fabry-Perot ("FP") laser, light-emitting diode ("LED") or other suitable light source. Accordingly, the TOSA 20 serves as an electro-optic transducer.

In addition, the transceiver 100 is configured to receive a data-carrying optical signal from an optical fiber operably connected to the ROSA 10. The ROSA 10 acts as an optoelectric transducer by employing a photodetector or other suitable device to convert the optical signal received via the connected optical fiber into an electrical data signal. The resulting electrical data signal is carried via a pair of differential receive signal lines. As is the case with the differential transmit signal lines, each signal line of the differential receive signal lines carries one of two streams of the differential electrical data signal that differ from each other only in signal polarity. As such, the lines are respectively referred to with a or a "−," indicating the respective positive or negative polarity of each line.

2. Structural and Operational Aspects

Figure 2:
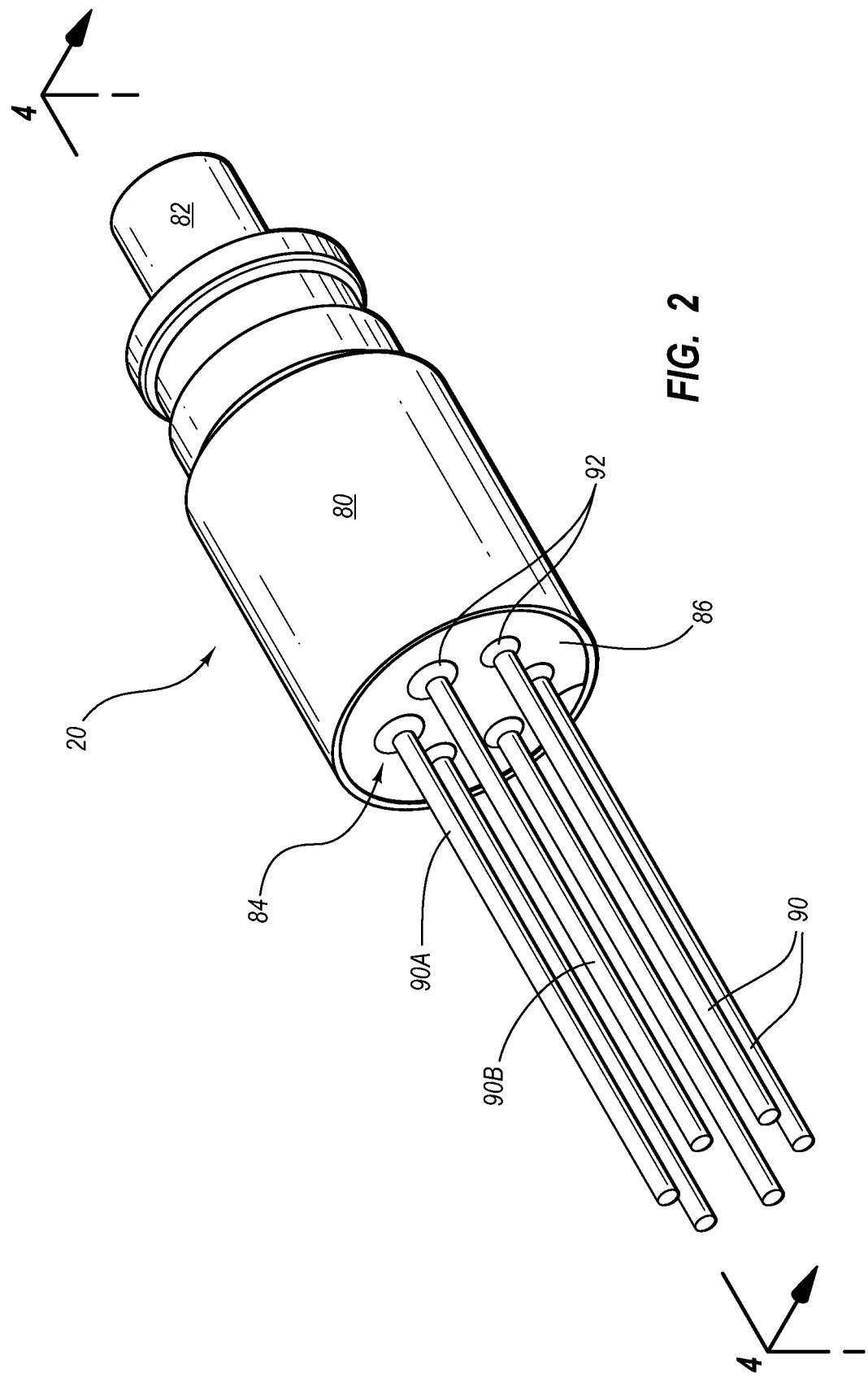
FIG. 2 is a perspective view of an optical subassembly that includes one embodiment of the present invention.
Figure 3:
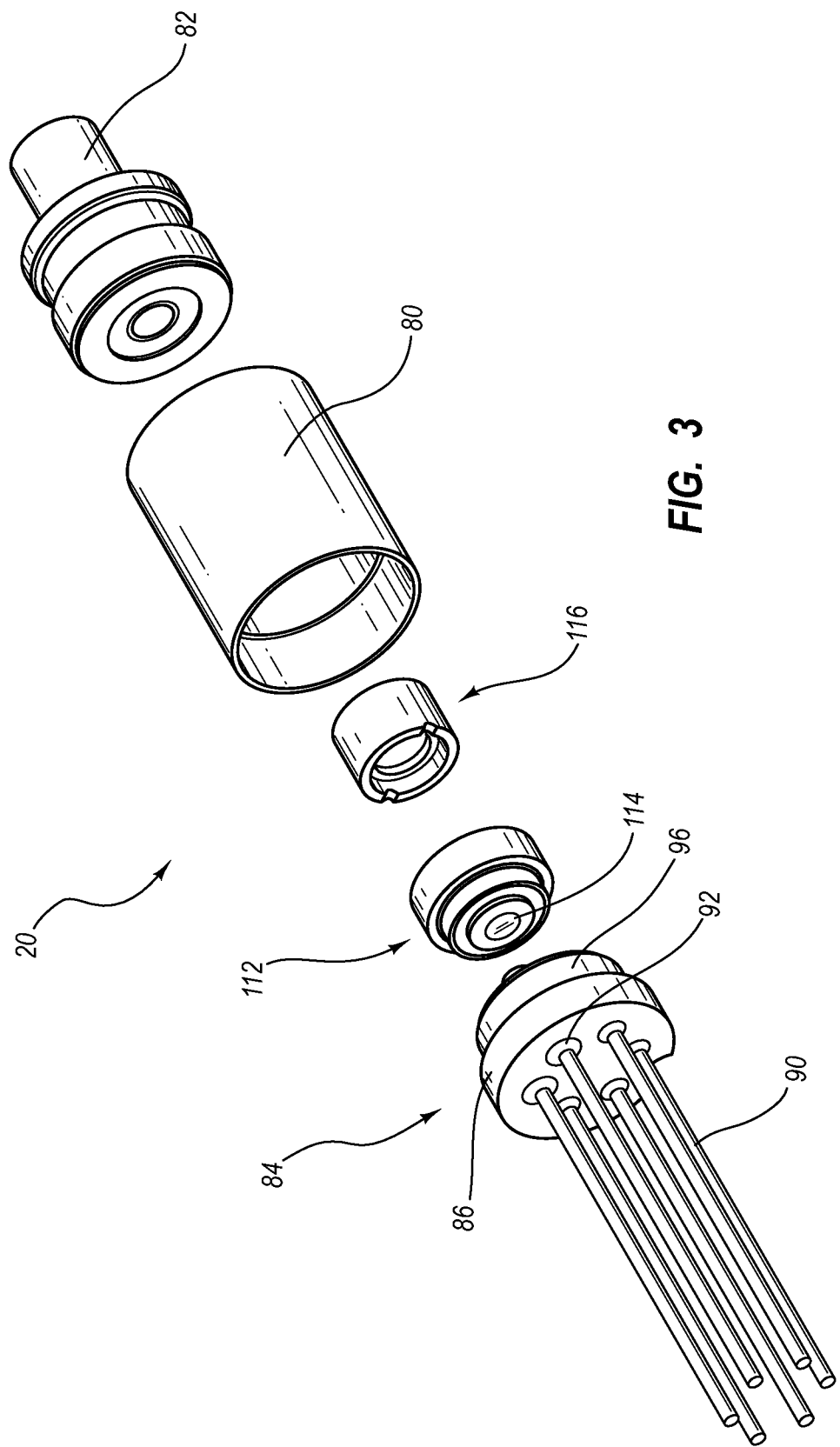
FIG. 3 is an exploded view of the optical subassembly of FIG. 2.

Together with FIG. 1, reference is now made to FIGS. 2 and 3, which show further details regarding a transmitter optical subassembly, generally designated at 20, which includes an embodiment of the present invention. Note that the TOSA 20 in FIGS. 2-4, though varying slightly in design, is similar in function and overall design to the TOSA shown in FIG. 1, thereby illustrating that embodiments of the present invention can be practiced in optoelectronic devices having a variety of configurations and designs. As has already been mentioned, other devices can also utilize embodiments of the present invention, as will be appreciated by those skilled in the art.

In further detail, the TOSA 20 includes a housing 80 that houses various internal components of the TOSA. A nosepiece 82 is attached to or integrally formed with the housing 80 and is configured to optically couple to a connectorized optical fiber (not shown) for enabling optical signals to be transmitted from the TOSA 20.

An optoelectronic package implemented as a transistor-outline ("TO") package 84 is shown mated with the housing 80. The TO package 84 includes a base 86 attached to an end of the TOSA shell 80. A cap, shown at 96 in FIG. 3, is positioned within an interior volume defined in part by the housing 80. The cap 96 mates with the base 86 to define an enclosure. Within this enclosure are included one or more electronic and optoelectronic components (not shown here) that are attached as described below.

The TOSA 20 further includes a plurality of leads 90 that extend through the base 86 via lead holes 94 that are defined in the base. A seal 92 surrounds the portion of each lead 90 disposed in the respective hole 94 so as to electrically isolate the lead from the base 86. The portions of the leads 90 that extend from the exterior surface of the base 86 are electrically connected to an electrical interface, such as those shown at 30 in FIG. 1, thereby enabling an electrical connection to be made with the PCB 50 of the transceiver 100. Though shown as extending a significant distance away from the exterior of the TOSA 20, the external leads 90 are clipped either before or after attachment to the electrical interface 30 so as to preserve the compact nature of the TOSA 20.

Portions of the leads 90 also extend into the interior volume created by the TO package base 86 and the cap 96. Various electronic and optoelectronic components of the TO package 84 electrically connect with the leads 90 in a manner that will be described further below. In this way, power and/or data signals are provided to the laser and other components disposed within the TO package 84.

In greater detail, the leads 90 include two differential transmit data lines 90A and 90B. These leads 90A and B can also be referred to as high speed or AC lines, and are responsible for carrying the electrical differential transmit data signals having respectively differing polarity as sent by the host. As will be seen in the discussion relating to FIG. 5, the data lines 90A and B are operably connected to the laser or other suitable light source of the TO package 84 so as to enable the differential electrical data signal to be converted to an optical data signal by the laser in preparation for launching the signal onto an optical fiber operably connected to the TOSA nosepiece 82.

Figure 4:
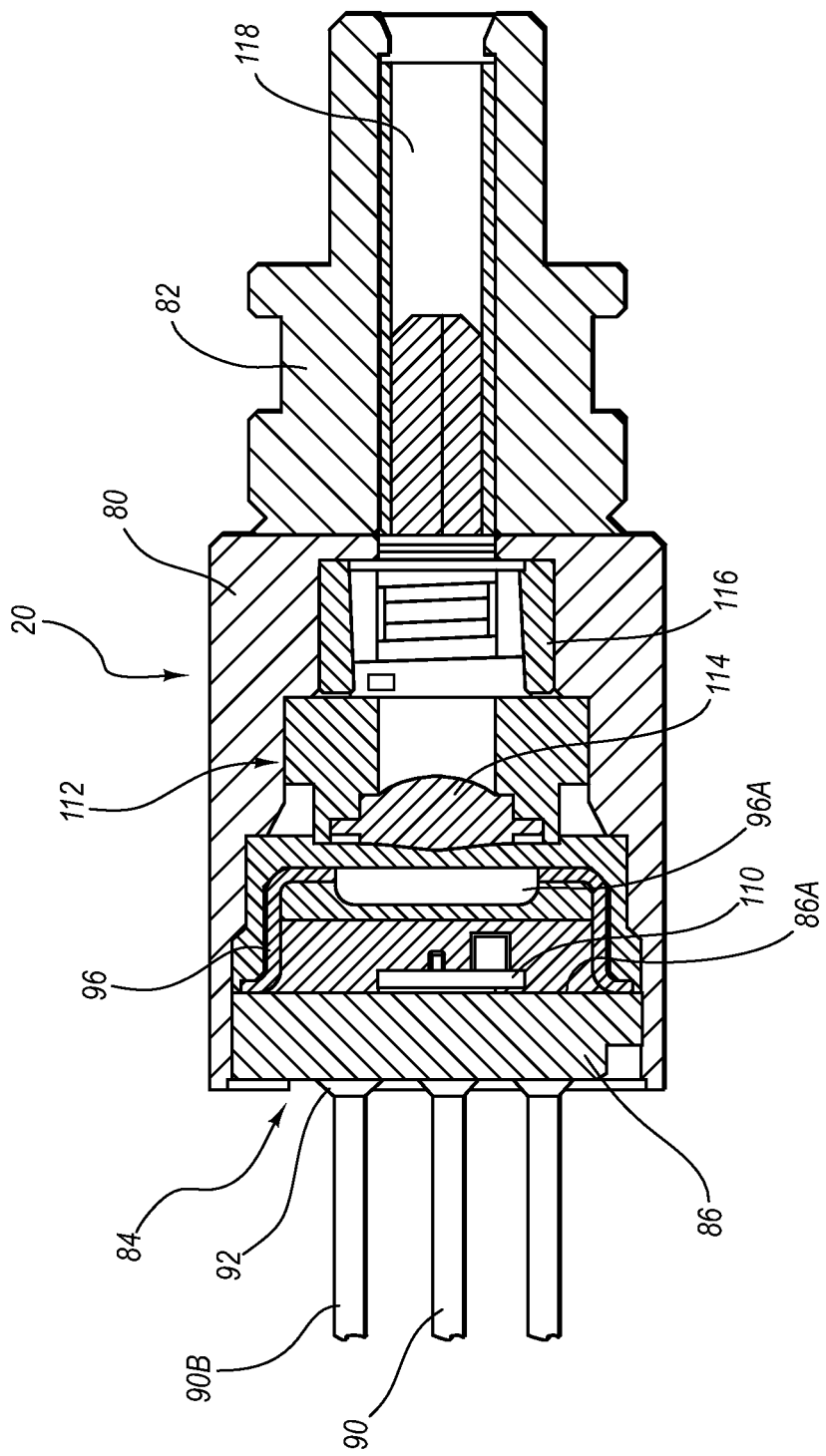
FIG. 4 is a cross sectional side view of the optical subassembly of FIG. 2, taken along the line 4-4, showing a TO package that includes an embodiment of the present invention.

FIGS. 3 and 4 depict yet other components of the TOSA 20. A submount 110 is included within a volume enclosed by the cap 96 on an interior surface 86A of the base 86 of the TO package 84. An optically transparent window 96A is included in the cap 96 to allow optical signals produced by the laser or light source (FIG. 5) disposed on the submount 110 to exit the TO package 84. A lens assembly 112 having a lens 112 and an isolator 116 are positioned along the optical signal light path to further condition the optical signal before it launches into an optical fiber that is operably coupled to a receptacle 118 of the nosepiece 82. It should be noted that, while the above discussion gives details regarding one possible environment for an embodiment the present invention, other alternative environments and device implementations can include embodiments of the present invention described herein. For instance, a TOSA not having each of the above listed components could be used. Or, in another embodiment, a ROSA could employ elements of the present invention in order to maintain signal line inductance, as will be further discussed below.

Figure 5:
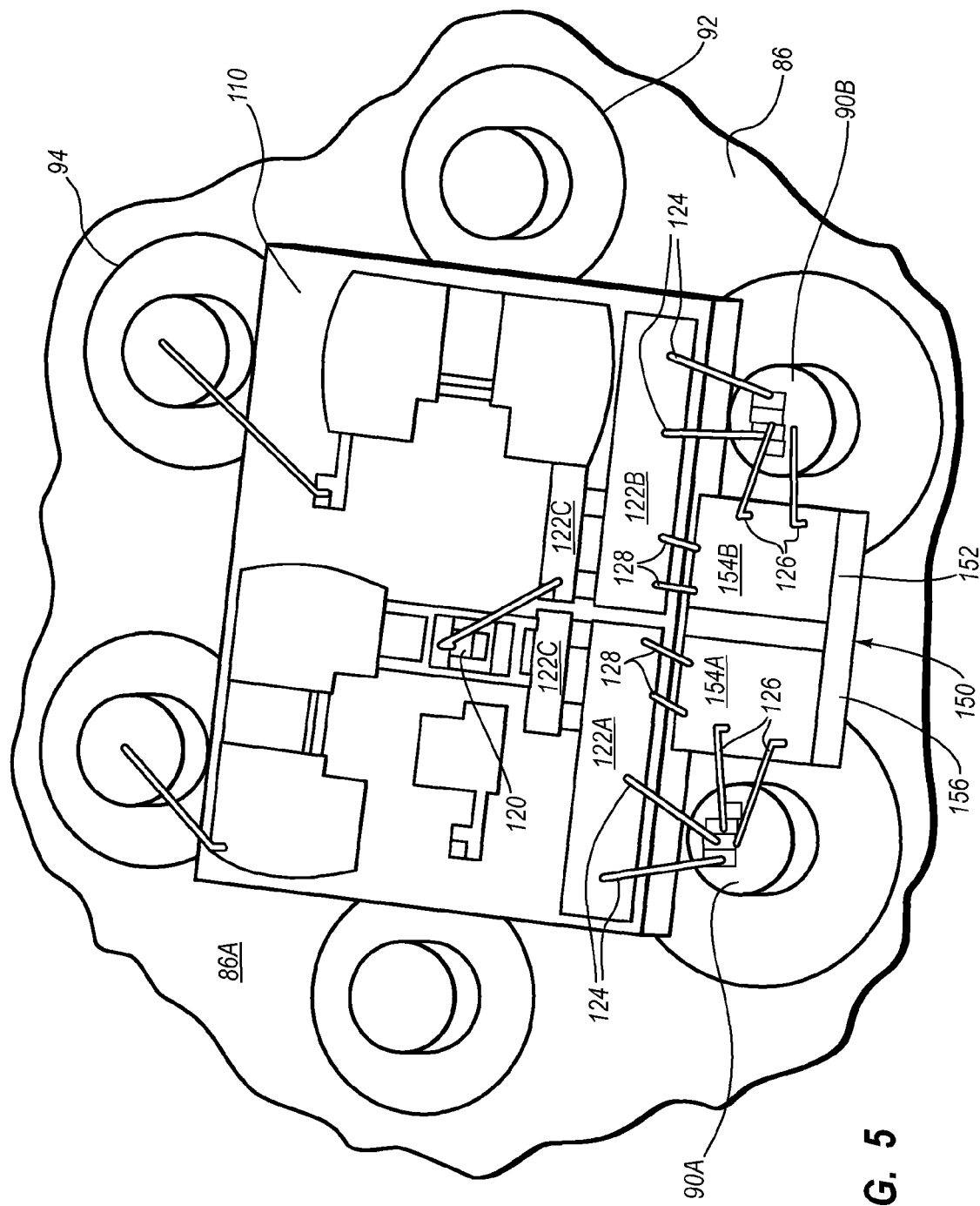
FIG. 5 is a perspective view of an interior surface of the TO package including a low inductance structure that is configured in accordance with one embodiment of the present invention.

Reference is now made to FIG. 5, which further depicts various details of the TO package 84. In particular, FIG. 5 depicts the interior base surface 86A and the submount 110 positioned thereon. The submount 110 in one embodiment is composed of aluminum nitride or aluminum oxide and is affixed to the interior surface 86 with an epoxy adhesive or other suitable fastening means.

A laser 120 is included on the surface of the submount 110 and is aligned with the window 96A (FIG. 4) of the cap 96 so as to enable the optical signal produced by the laser to be emitted from the TO package 84, as described above. The laser 120 is electrically connected to various traces 122 disposed on the surface of the submount 110 so as to provide a bias power supply to the laser. In addition, the laser 120 is electrically connected via selected traces 122 to the differential signal lines 90A and 90B so as to enable the differential data signal carried by the signal lines to be modulated onto the laser optical signal. As such, the laser 120 acts as an electro-optic transducer for converting an electrical data signal to an optical signal.

The differential signal lines 90A and 90B are electrically connected to adjacent traces 122A and 122B, respectively, by a plurality of wire bonds 124. As shown in FIG. 5, the length of the wire bonds 124 is sufficient to bridge the gap between the respective lead 90A or 90B and the respective trace 122A/B, while remaining as short as possible. Note that, due to the small component size and limited space involved, only two wire bonds 124 extend between each lead 90A or 90B and the respective trace 122A/B on the submount 110.

In accordance with one embodiment, the TOSA 10 described herein includes structures and features designed to maintain an inductance of the data signal path from the differential signal lines 90A and 90B to the laser 120 at desirably low levels. As shown in FIG. 5, this is accomplished in one embodiment by a low inductance structure, or "LIS," generally designated at 150. The LIS 150 assists in providing additional signal pathways between the differential signal leads 90A, 90B and the traces 122 of the submount 110. Further, the LIS 150 enables the net length of wire bonds between the differential signal leads 90A, 90B and selected traces to be reduced. Each of these features enables the LIS to assist in controlling signal line inductance for the TOSA 10.

As shown, the LIS 150 includes a body 152, similar in thickness and composition to the submount 110. In the present embodiment, the LIS body 152 is composed of aluminum nitride, aluminum oxide, or a suitable dielectric and is affixed to the interior surface 86A of the TO package base 86 via and adhesive such as epoxy, or in another suitable manner. Though not so configured here, the LIS 150 can also be affixed directly to the adjacent portion of the submount 110. Conductive traces 154A and 154B are disposed atop the LIS body 152 and are electrically connected to respective traces 122A and 122B on the surface of the submount 110 via wire bonds 128. The top surface of the LIS 150 in the present embodiment is substantially level with the top surface of the submount 110, though in other embodiments this may not be the case. At least one ground conductive trace 156, shown in FIG. 6B, is also included on a bottom surface of the LIS body 152.

The LIS body 152 is positioned proximate the differential signal leads so as to permit wire bonding to occur between the leads and the LIS 150. In the illustrated embodiment, the LIS body 152 is interposed between the differential signal line leads 90A and 90B. Further, the LIS body 152 is sized such that it overhangs a portion of each lead hole 94 through which the differential signal line leads 90A and 90B pass. This positional configuration enables the LIS 150 to be situated substantially close to the differential signal line leads 90A and 90B.

As mentioned, positioning the LIS 150 substantially close to the differential signal line leads 90A and 90B enables the LIS to be electrically connected with those leads. In particular, wire bonds 126 can be used to electrically connect each differential signal line lead 90A, 90B with the respective traces 154A/154B disposed atop the LIS body 152. Connection of the LIS traces 154A, 154B with the submount traces 122A and 122B, respectively, establishes a distinct signal line path from the differential signal line leads 90A, 90B to the submount 110 in addition to the path from the signal line leads via the wire bonds 124 to the traces 122A and 122B.

The LIS 150 and submount configuration described above desirably lowers overall signal line inductance in several ways. First, the additional signal line path from the differential signal line leads 90A and 90B to the submount traces 122A and 122 B via wire bonds 126 and the traces 154A and 154B of the LIS 150 desirably provides more proximate trace connection space for wire bonds to electrically connect from the differential signal line leads 90A, 90B to the submount traces 122. Thus, relatively more wire bonds can be used for this connection, which results in a signal line inductance drop over other known designs. Further, the average length of the wire bonds used for this interconnection is less than what it would be if the same number of wire bonds was used without the LIS being present on the base interior surface 86A. This shortening of average wire bond length further desirably reduces signal line inductance when compared with relatively longer wire bonds. This lower inductance improves the RF signal transition from the signal line leads to the submount and results in a general improvement in the quality of the signal line pathway through which these electrical data signals are passed.

Second, the LIS 150 provides a reduction in the length of a ground current return path for ground currents associated with the differential signals carried on the differential signal line leads 90A, 90B. Specifically, because the ground currents of the signal line leads 90A and 90B are complementary, bringing them together on the conductive pad 156 disposed on the bottom surface of the LIS 150—which pad is electrically connected to the base 86—will cause the ground currents to substantially cancel each other. This in turn reduces the subsequent contribution by the ground currents to the overall inductance of the signal path, thereby reducing overall signal line inductance.

Third, the structure of the LIS 150 provides a compensating capacitance to help offset net inductance that is present in the differential signal paths. This net inductance is introduced by the various bond wires and signal path geometry of the differential signal line leads 90A, 90B. The compensating capacitance results from the spatial arrangement of the dielectric material of the LIS body and the top and bottom conductive pads 154A, B and 156. In other embodiments, the compensating capacitance can be increased or decreased by changing the thickness, width, length, and/or dielectric material of the LIS body 152. A suitable selection of materials and geometry for the LIS 150 therefore improves the overall balance of inductance and capacitance in the total signal path, allowing for a more efficient overall communication of signals via the signal path, especially at high frequencies over 1 GHz. In one embodiment, for example, the LIS dielectric body is composed of alumina, is approximately 1 mm long, and 0.5 mm wide. Other compositions and dimensions are, of course, possible.

Fourth, the LIS 150 defines a transmission line structure as part of the differential signal line path, and therefore features distributed capacitance and distributed inductance to improve the efficient transmission of data signals along its length. In detail, because the top pads 154A and 154B of the LIS 150 run parallel to the LIS bottom pad 156, the LIS 150 defines a microstrip transmission line. This microstrip transmission line conducts a high frequency signal with greater efficiency than the various bondwires and thus can provide an overall improvement of the total signal path performance as a result of its ability to reduce overall bondwire length.

Note that the LIS 150 in FIG. 5 is electrically connected to both the differential signal line leads 90A and 90B and to the submount traces 122A and 122B via wire bonds 126 and 128, respectively. In another embodiment, however, one or both of these electrical interconnections could be established via soldering, including a solder bridge, which can further reduce signal line inductance. For such a soldering connection to be established between the respective lead 90A/90B and the LIS 150, the distance between these components must be sufficiently small, such as the spacing shown in FIG. 5. In addition, other electrical interconnection schemes could be employed, as appreciated by one skilled in the art.

FIG. 6 shows a top view of the TO package base 86 and submount 110, including the LIS 150. These figures show various additional aspects of the submount 110, including a monitor photodiode ("MPD") 170 and reflector 172 that are each positioned with respect to the laser 120. Again, it is appreciated that the LIS as described herein can be employed in optical transmitters and even optical receivers of a variety of types and configurations. Note also that the gap shown in FIG. 6 between the LIS 150 and the adjacent edge of the submount 110 can exist or be omitted according to interconnection design, package dimensions, or other considerations, as appreciated by one skilled in the art. This gap in one embodiment has a spacing of between approximately 10 to 50 microns, for example.

Figure 8:
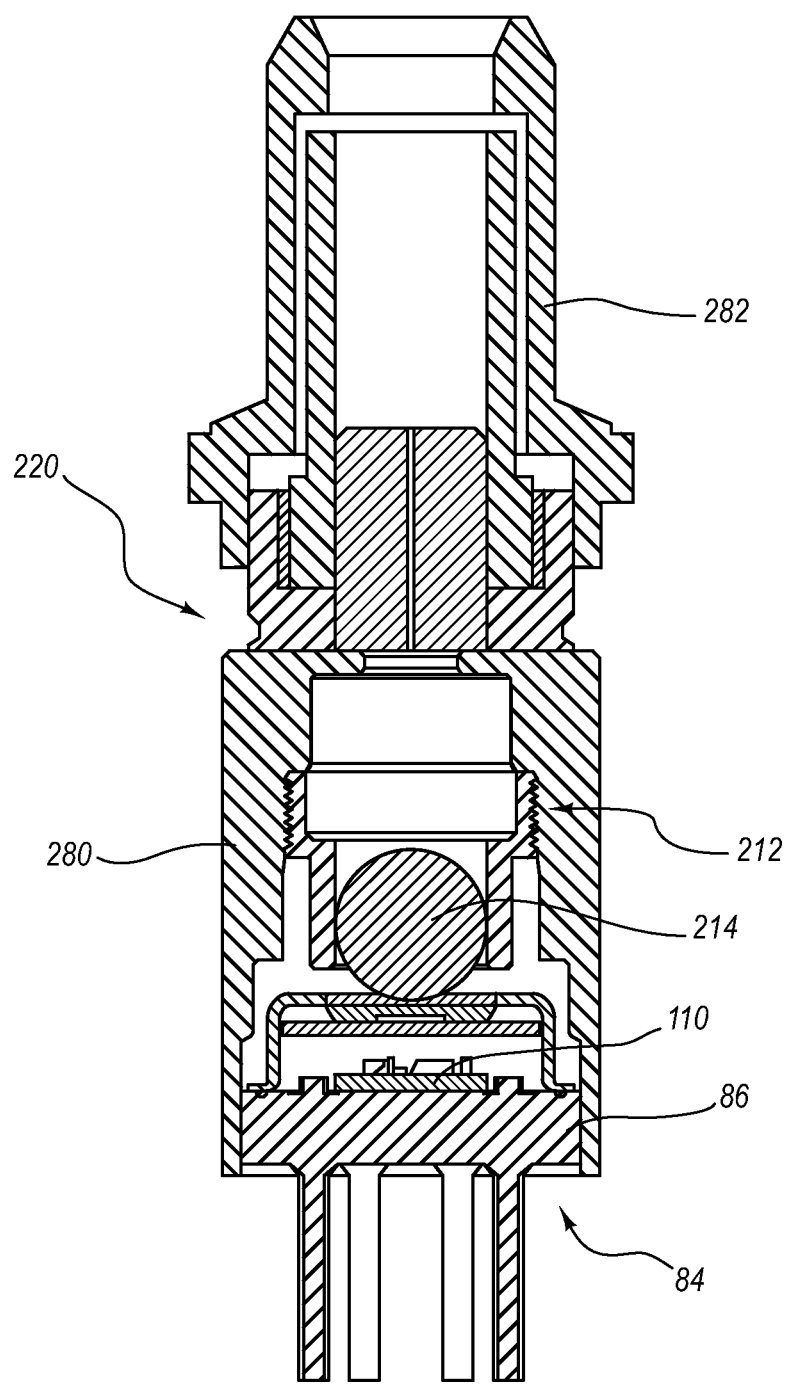
FIG. 8 is a cross sectional side view of an optical subassembly, showing a TO package that includes an embodiment of the present invention.

FIG. 8 depicts a TOSA 220 including an embodiment of the present invention and includes a housing 280 and a nosepiece 282. The TOSA 220 includes a TO package 84 having a base 86 and a submount 110 configured as described above. Also shown is a lens assembly 212 having a ball lens 214, in contrast to the convex lens 114 shown in the embodiment of FIG. 4. The embodiment of FIG. 8 therefore shows one example of use of a low inductance structure in one of various different optical subassembly structures.

Figure 9:
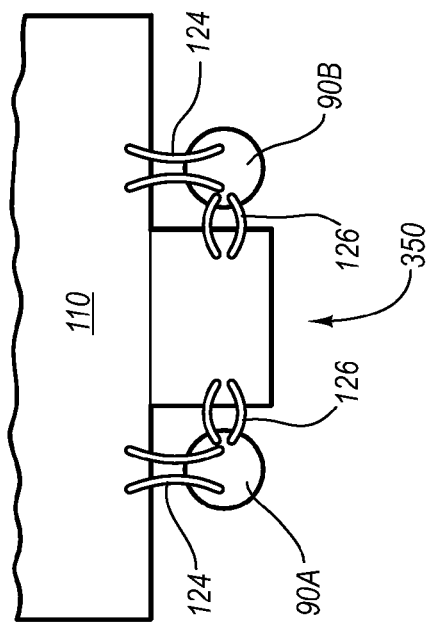
FIG. 9 is a simplified top view of an interior surface of a TO package including a low inductance structure in accordance with an alternative embodiment.
Figure 11:
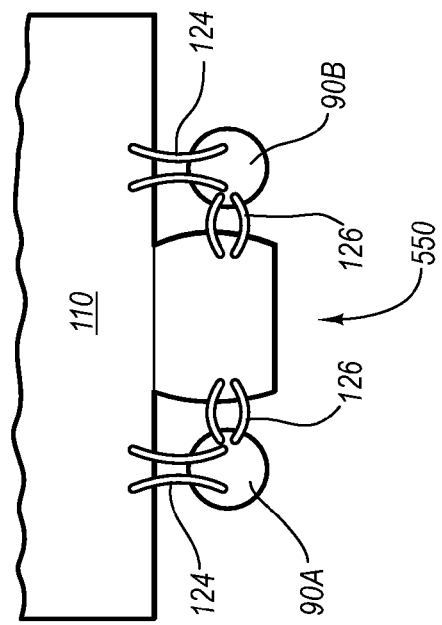
FIG. 11 is a simplified top view of an interior surface of a TO package including a low inductance structure in accordance with yet another embodiment.
Figure 10:
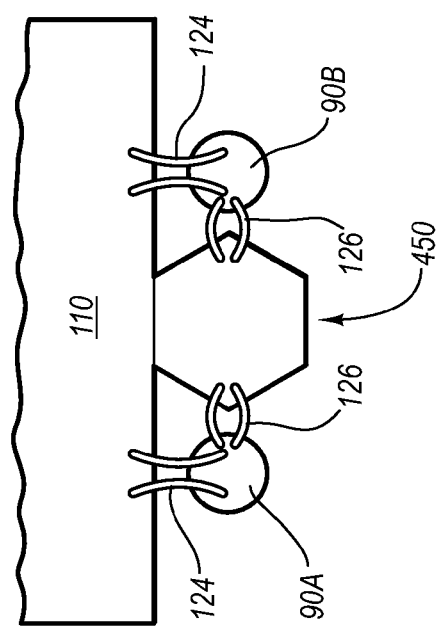
FIG. 10 is a simplified top view of an interior surface of a TO package including a low inductance structure in accordance with another embodiment.

Reference is now made to FIGS. 9-11, which depict various details regarding exemplary alternative embodiments of the present invention. These alternative embodiments share many similar features to those described above; as such, only selected features are discussed below. In FIG. 9, a low inductance structure ("LIS") 350 is shown, having wire bond connections to the differential signal line leads 90A and 90B via wire bonds 126. The leads 90A and 90B are also directly connected to traces of the submount via the wire bonds 124. The LIS 350 shown here is integrally formed with the submount 110, thereby obviating the need for wire bond connections therebetween. Thus, it is seen that the LIS can be an integral part of the submount while still providing a desired low inductance pathway for the differential signal line leads.

FIGS. 10 and 11 depict possible LIS body shapes. In particular, FIG. 8 shows an LIS 450 having a hexagonal body design, which provides an even lesser spacing between the LIS and the respective differential signal line lead 90A, 90B. In FIG. 9, an LIS 550 is shown having a partially rounded body perimeter, which also reduces the spacing between the LIS and the differential signal line leads 90A, 90B. These and other shaped LIS designs are therefore contemplated by embodiments of the present invention.

Figure 12B:
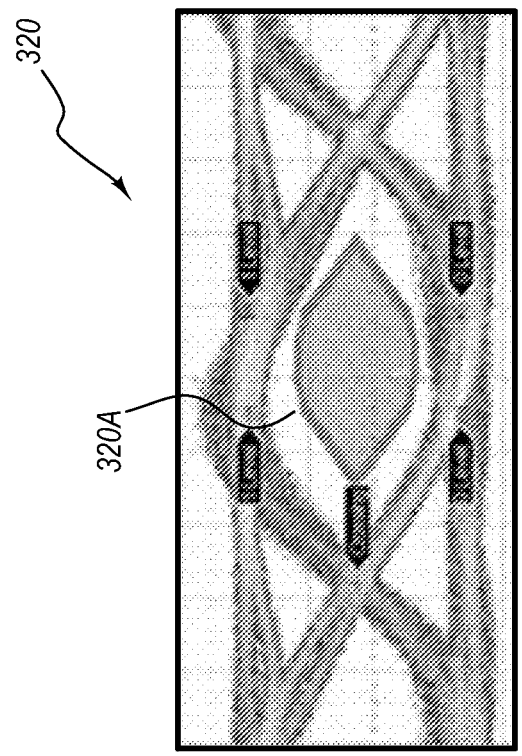
FIGS. 12A and 12B are eye diagrams showing the effects of practice of one embodiment of the present invention.
Figure 12A:
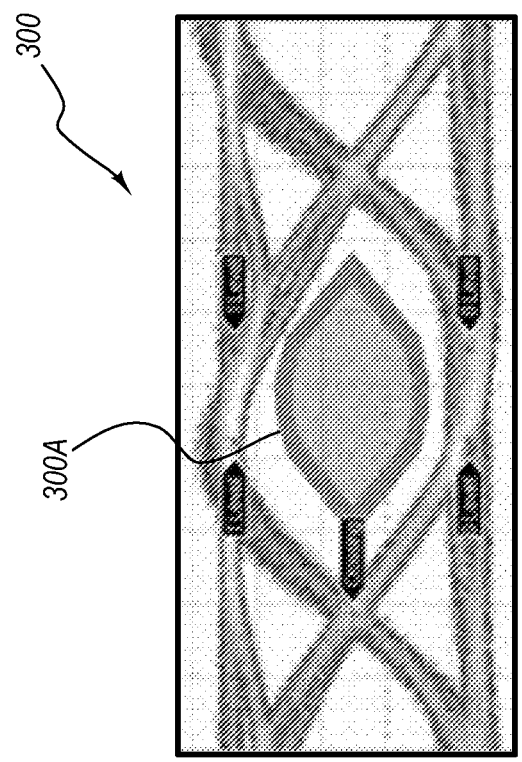

FIGS. 12A and 12B contrast use of the LIS of the present invention over known designs. An eye diagram 300 is shown in FIG. 12A, taken from a TOSA having the LIS described as in the above embodiments and including a central eye portion 300A. The central eye portion 300A indicates a relatively clear eye opening for the eye diagram 300, in contrast to a central eye portion 320A of an eye diagram 320 taken from a TOSA not having the LIS, as shown in FIG. 12B. This is a result of the improved inductance and signal quality characteristics made possible by the LIS of embodiments of the present invention.

Figure 13A:
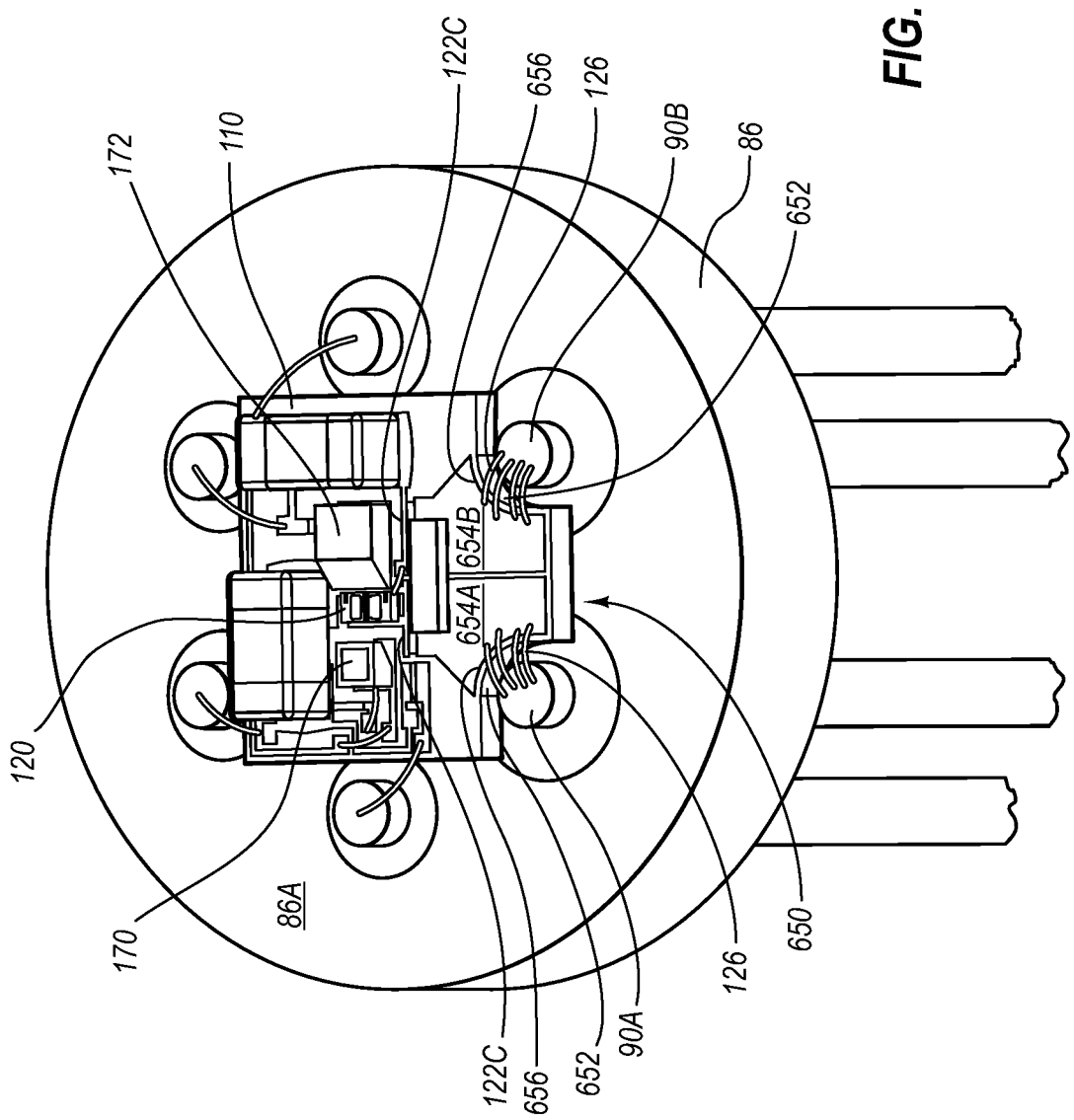
FIGS. 13A and 13B are perspective and top views, respectively, of a TO package that includes another embodiment of the present invention.
Figure 13B:
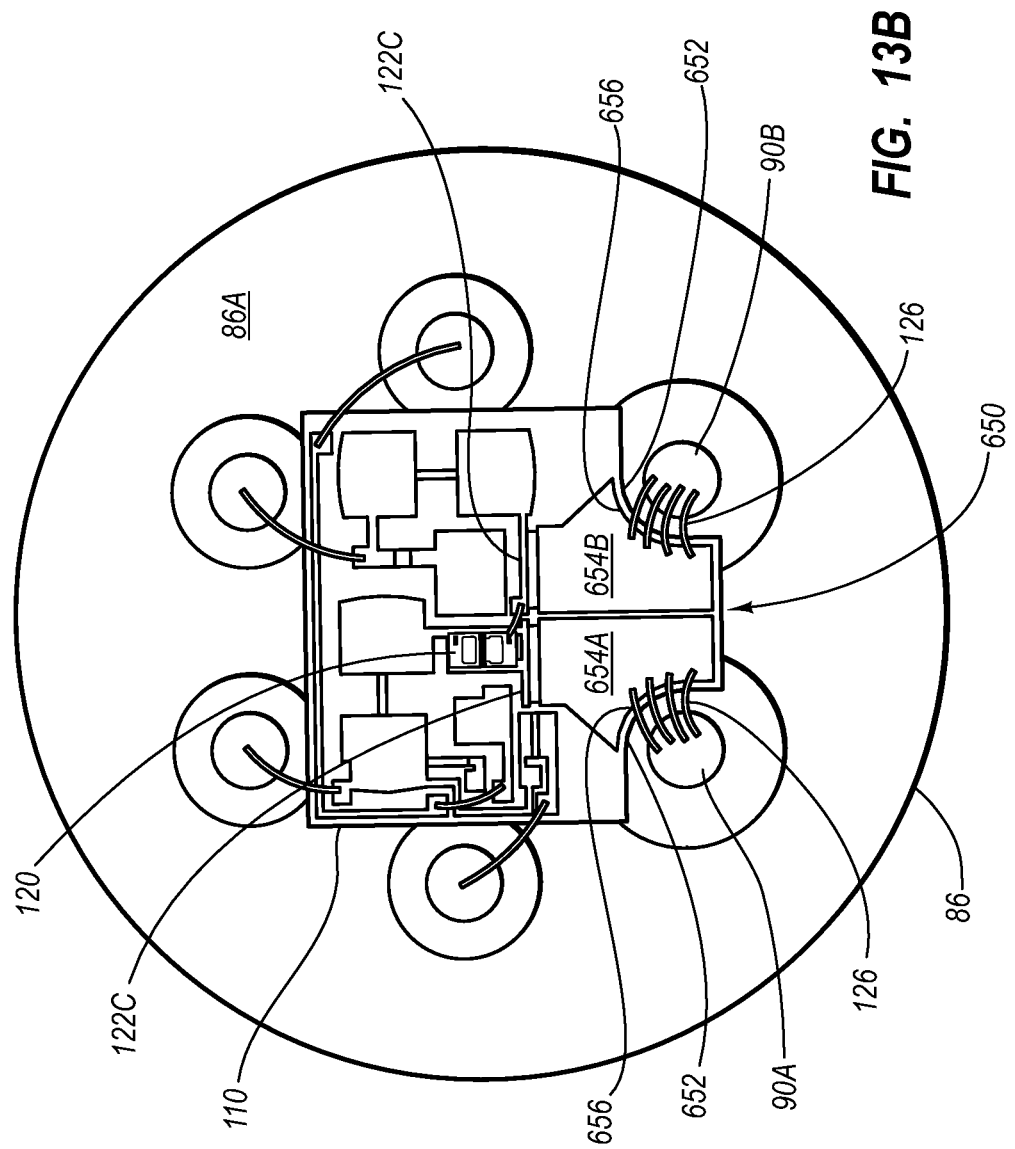

As mentioned in connection with FIG. 9, in one embodiment the low inductance submount can be integrally formed with the main portion of the submount. FIG. 13A and 13B show yet another example of such a configuration, wherein a LIS 650 is shown interposed between the leads 90A and 90B and integrally formed with the submount 110. The LIS 650 includes a body having shaped edges 652 that are curved so as to provide an equal, curved gap—approximately 100 to 200 microns in width in one embodiment—between the adjacent outer perimeter of each lead and the corresponding shaped edge of the LIS. Other gap sizes are, of course, possible in other embodiments. In addition, pad structures 654A and 654B are disposed atop the LIS 650, and each includes a shaped perimeter portion 656 adjacent the LIS shaped edges 652.

The particular configuration of the LIS shaped edges 652 and contact pad perimeter portions 656 enables the distance between each lead 90A, 90B and the corresponding LIS pads 654A, 654B spanned by the wirebonds 126 to be minimized, so as to desirably provide the inductance-lowering advantages described above. Note again that the embodiment as illustrated is simply one example of an LIS structure that is integrally formed with the submount; other designs are also possible.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A submount assembly for mounting on a base of an optoelectronic package having first and second signal leads, the submount assembly comprising:
   a submount body including a mounting surface on which an optoelectronic component is disposed;
   first and second traces on the mounting surface in electrical communication with the optoelectronic component;
   a plurality of first electrical connections each in direct physical contact with the first trace and the first signal lead, the first electrical connections configured to function as a direct signal path between the first trace and the first signal lead; and
   a low inductance structure interposed between the first signal lead and the second signal lead, the low inductance structure including:
      a dielectric body;
      first and second conductive features included on the dielectric body;
      a plurality of second electrical connections each in direct physical contact with the first signal lead and the first conductive feature; and
      a plurality of third electrical connections each in direct physical contact with the first conductive feature and the first trace, the second and third electrical connections configured to function together as an indirect signal path from the first signal lead to the first trace through the first conductive feature.

2. The submount assembly as defined in claim 1, wherein the first, second, and third electrical connections are wirebonds.

3. The submount assembly as defined in claim 2, wherein the low inductance structure enables the inclusion of additional wirebonds between the submount body and the first and second signal leads.

4. The submount assembly as defined in claim 1, wherein the low inductance structure further comprises at least one conductive pad included on the dielectric body opposite the first and second conductive features, and the at least one conductive pad contributes to cancelling a ground current of the first and second signal leads.

5. The submount assembly as defined in claim 1, wherein the low inductance submount provides a compensating capacitance relating to signals carried by the first and second signal leads.

6. The submount assembly as defined in claim 1, wherein the optoelectronic component is a laser diode.

7. The submount assembly as defined in claim 1, wherein the first trace on the mounting surface is substantially flush with the first and second conductive features included on the dielectric body.

8. The submount assembly as defined in claim 1, wherein each of the first and second conductive features comprises a conductive trace.

9. The submount assembly as defined in claim 1, wherein each of the first and second conductive features comprises a conductive pad.

10. The submount assembly as defined in claim 1, further comprising:
   a plurality of fourth electrical connections each in direct physical contact with the second trace and the second signal lead, the fourth electrical connections configured to function as a direct signal path between the second trace and the second signal lead;

a plurality of fifth electrical connections each in direct physical contact with the second signal lead and the second conductive feature; and a plurality of sixth electrical connections each in direct physical contact with the second conductive feature and the second trace, the fifth and sixth electrical connections configured to function together as an indirect signal path from the second signal lead to the second trace through the second conductive feature.

11. The submount assembly as defined in claim 1, wherein the dielectric body is composed of alumina and is approximately 1 mm long and approximately 0.5 mm wide.

12. The submount assembly as defined in claim 1, wherein the dielectric body has a hexagonal body design to provide less spacing between the first and second conductive features on the dielectric body and the first and second signal leads.

13. The submount assembly as defined in claim 1, wherein the dielectric body has a partially rounded body perimeter to provide less spacing between the first and second conductive features on the dielectric body and the first and second signal leads.

* * * * *